June 26, 1962 T. M. INGMAN 3,041,472

TRANSISTOR SWITCHING CIRCUITS

Filed Aug. 9, 1960

THOMAS M. INGMAN,
INVENTOR.

BY Spensley and Horn

ATTORNEYS.

United States Patent Office 3,041,472

Patented June 26, 1962

3,041,472

TRANSISTOR SWITCHING CIRCUITS

Thomas M. Ingman, North Hollywood, Calif., assignor to Electrosolids Corporation, Panorama City, Calif., a corporation of California Filed Aug. 9, 1960, Ser. No. 48,395
8 Claims. (Cl. 307—88.5)

This invention pertains to electronic power regulating apparatus and more particularly to such apparatus utilizing semiconductor devices in the switched mode of operation.

Various electronic power regulating devices have been developed to provide an output voltage which remains relatively constant upon load variations. With the recent development of transistors capable of handling large amounts of power, electronic devices utilizing semiconductors as power handling components have become feasible, particularly for use in regulated output electrical power systems in which high reliability and efficiency are paramount. High efficiency is obtainable by operating the transistors in a switching mode and, if necessary, reducing the resulting rectangular wave output to a desired output waveshape or to a D.C. voltage by proper filtering. Hence, switched operation of semiconductor devices can be advantageously employed in static inverter systems for converting D.C. electricity to polyphase A.C. electricity.

In switched operation the transistors are alternately switched between the high-voltage low-current cutoff condition and the high-current low-voltage saturated condition, passing very rapidly through the intermediate high-dissipation regions. Under these operating conditions the dissipated power is quite small in comparison to the total power switched, particularly if power transistors having a very low saturation resistance are used.

Output regulated electronic devices utilizing switched operation of power transistors have heretofore achieved the desired output regulation through the use of a magnetic amplifier having a control winding which senses output voltage. However, a magnetic amplifier contributes a significant amount of weight to a system in which it is used, particularly if it regulates operation of the output stage rather than an intermediate low power stage. Furthermore, when used in a static inverter system providing a polyphase sine wave output the magnetic amplifier method of regulation is generally unsatisfactory if the phase angles must be closely regulated.

The disadvantages of conventional magnetic amplifier regulation have been overcome with the recent development of a so-called "notch-regulation" method in which the desired regulation is accomplished by time modulation of the switched wave form. In the notch-regulation method the duration of the conduction times of the switched transistors are varied in accordance with the output power desired. This variation is commonly achieved in a pulse forming stage through variation of transistor bias by a D.C. amplifier controlled either manually or by the output voltage of the system. The signal input to the pulse forming stage is typically a sine wave voltage of constant amplitude and of a desired A.C. frequency, and since the transistors in this stage are operated in the switched mode the output will be a series of rectangular pulses that vary in time duration with load but remain fixed in amplitude and period. By varying the pulse length in this manner control of the energy content of the signal pulses is achieved. Under maximum load conditions the switching pulses are of maximum length, the switching between positive and negative pulses being practically instantaneous to thereby produce a square wave output. Under lighter load conditions, less output power is required so the pulse length is shortened by introduction of a switching dwell time to thereby produce a series of spaced rectangular pulses. Since the pulse period remains constant with variations in load, the lighter the load the shorter the pulse length and the longer the switching dwell time or "notch."

The notch-regulated output signal from the pulse forming stage is fed to a driver stage which in turn feeds a power output stage, both of the latter stages utilizing transistors in the switched mode of operation.

With commonly used driver systems, the driver stage must be capable of continuously providing the power output stage with the amount of drive necessary under maximum load conditions. The driver stage provides this maximum amount of driving power regardless of the amount of load, hence, under light load conditions the driver is operating quite inefficiently since only a small portion of the produced drive power is actually required.

Accordingly, it is an object of the present invention to provide improved transistor switching circuitry.

It is also an object of the present invention to provide improved electronic voltage regulating circuitry utilizing transistors in the switched mode of operation.

It is another object of the present invention to provide improved power amplifier systems utilizing transistors in the switched mode of operation.

It is a further object of the present invention to provide transistor switching circuitry having low excitation requirements.

It is a still further object of the present invention to provide improved power amplifier systems for the amplification of voltages having a generally rectangular waveshape.

It is yet another object of the present invention to provide improved power amplifier systems for notch-regulated static inverters.

It is also an object of the present invention to provide improved power amplifier systems for notch-regulated D.C. voltage regulators.

Other objects and a fuller understanding of the present invention may be had by reference to the following description and the accompanying drawing, in which like reference characters are used to refer to like parts throughout, and wherein.

Figures 1, 2, 3:
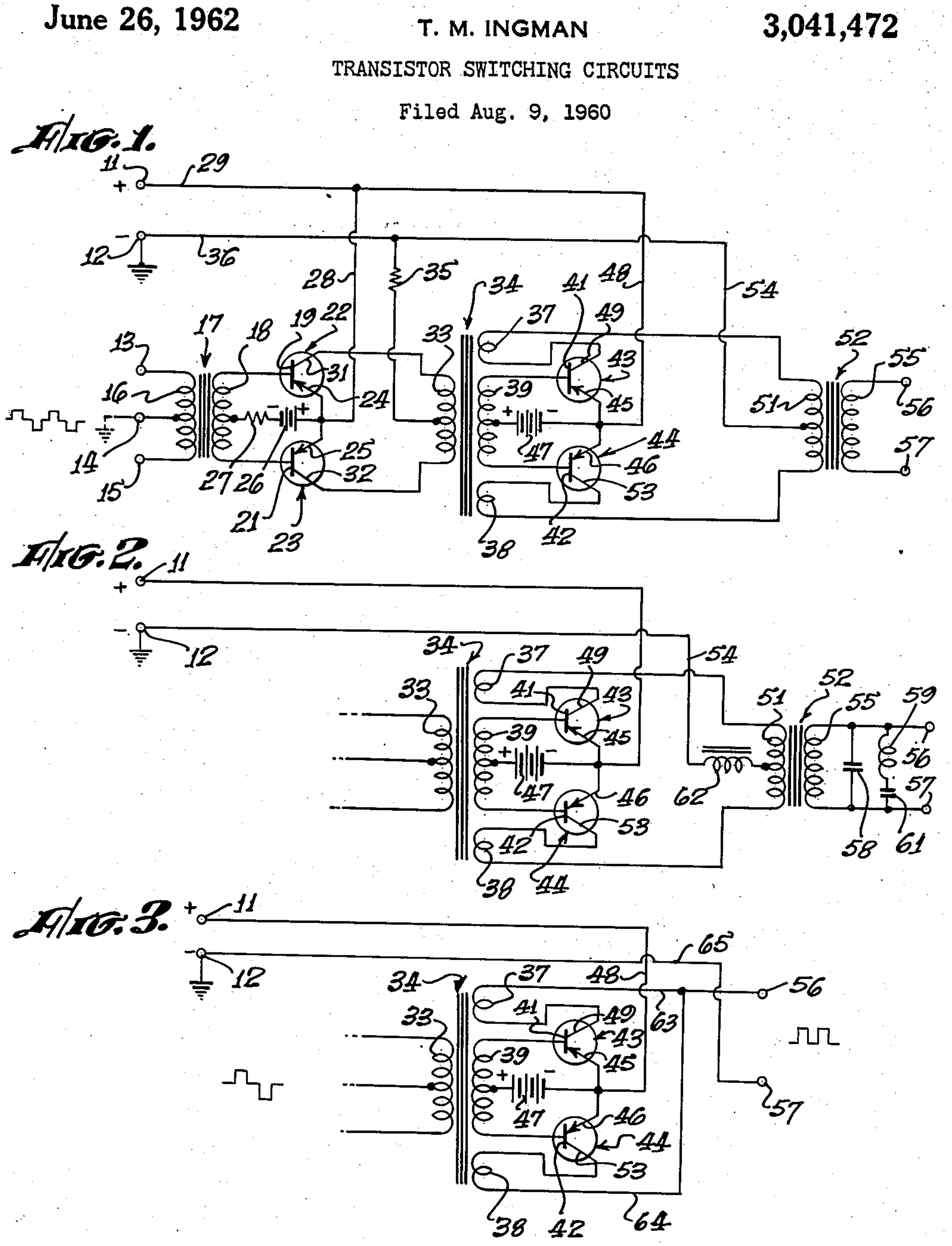
FIGURE 1 shows a schematic diagram of a basic embodiment of the present invention.
FIGURE 2 shows a schematic diagram of a particular embodiment of the power output stage of the present invention suitable for use in a static inverter device producing a sine wave alternating current output.
FIGURE 3 shows a schematic diagram of a particular embodiment of the power output stage of the present invention suitable for use in a D.C. voltage regulating system.

Referring now to FIGURE 1, there is shown a schematic diagram of driver and power output stages of a notch-regulated power amplifier system in accordance with a basic embodiment of the present invention. The stages are powered from a D.C. voltage source, not shown, adapted for connection to a pair of D.C. voltage terminals 11 and 12 in accordance with the indicated polarity. The negative terminal 12 is connected to a point of common potential, i.e., ground. Balanced input terminals 13, 14 and 15 are provided for the connection of circuitry which develops the notch-regulated A.C. signal voltage in the hereinabove described manner. The terminals 13, 14 and 15 are directly connected to the center-tapped primary winding 16 of an input transformer 17.

The input transformer 17 has a center-tapped secondary winding 18, the ends of which are connected to base electrodes 19 and 21 of driver transistors 22 and 23 respectively. Emitter electrodes 24 and 25 of the driver transistors 22 and 23, respectively, are jointly connected to the center tap of the secondary winding 18 through a bias battery 26 and a current limiting resistor 27. The emitter electrodes 24 and 25 are also jointly connected to the positive D.C. input terminal 11 through interconnecting leads 28 and 29. Collector electrodes 31 and 32 of the driver transistors 22 and 23, respectively, are connected to the ends of a center-tapped primary winding 33 of a driver transformer 34. The center tap of the primary winding 33 of the driver transformer 34 is connected to the negative D.C. voltage terminal 12 through a current limiting resistor 35 and an electrical lead 36.

The driver transformer 33 has three secondary windings, a first feedback winding 37, a second feedback winding 38, and a center-tapped secondary winding 39. The ends of the secondary winding 39 of the driver transformer 33 are connected to base electrodes 41 and 42 of power transistors 43 and 44, respectively. Emitter electrodes 45 and 46 of the power transistors 43 and 44, respectively, are jointly connected to the center tap of the secondary winding 39 by a bias battery 47, polarized as shown. The emitter electrodes 45 and 46 are also jointly connected to the positive D.C. voltage terminal 11 through a connecting lead 48 and the connecting lead 29. Collector element 49 of the power transistor 43 is connected to one end of the first feedback winding 37 of the driver transformer 34, the other end of the first feedback winding 37 being connected to one end of a center-tapped primary winding 51 of an output transformer 52. Collector element 53 of the power transistor 44 is connected to one end of the second feedback winding 38 of the driver transformer 34, the other end of the second feedback winding 38 being connected to the other end of the center-tapped primary winding 51 of the output transformer 52. The center tap of the primary winding 51 is connected to the negative D.C. voltage terminal 12 through a connecting lead 54 and the connecting lead 36. The output transformer 52 is provided with a secondary winding 55, which is connected to a pair of output terminals 56 and 57.

In the basic embodiment of FIGURE 1 the driver transistors 22 and 23 are biased in the forward direction by the bias battery 26. The output voltage of the bias battery 26, in conjunction with the resistance value of current limiting resistor 27, is chosen to provide an amount of forward bias which will maintain the driver transistors 22 and 23 in a saturated condition in the absence of a signal input to the terminals 13, 14 and 15. The current limiting resistor 27 is to prevent an excessive collector current flow during periods of driver transistor saturation. In the absence of a signal input the saturated driver transistors 22 and 23 effectively provide a short circuit across the primary winding 33 of the driver transistor 34. The purpose of this effective short circuit across the primary winding 33 under conditions of no signal input provides a stabilizing effect on the power amplifier stage, in a manner to be hereinafter explained. Upon application of a rectangular signal input pulse the forward bias on one of the driver transistors will be overcome and the flow of collector current in that transistor abruptly cut off to thereby induce a voltage across a portion of the primary winding 33 of the driver transformer 34 to thereby effectively reproduce the signal input pulse.

The feedback windings 37 and 38 on the driver transformer 34 are wound to provide positive feedback of power transistor collector current flow. Being current feedback windings, they are composed of a relatively few turns of heavy wire. Under the conditions of switched operation encountered in these stages, a beginning of power transistor collector current flow will cause that transistor to quickly reach saturation because of the positive feedback effect. Utilization of positive feedback enables a significant reduction in drive requirements, since only that small amount of drive necessary to start collector current flow is required.

In the absence of a signal input to the driver transformer 34, the power transistors 43 and 44 are biased to cutoff by the bias battery 47. Because of the damping effect of the short circuit of primary winding 33 under these conditions, regeneration of the power stage will be prevented and the power stage will be held in a quiescent condition. Upon application to the driver stage of a signal input pulse, however, primary winding 33 of the driver transformer 34 will no longer be short circuited and a signal pulse will be reproduced in the secondary winding 39. Depending upon the polarity of the pulse appearing across secondary winding 39, one or the other of the power transistors will begin to conduct and will be quickly driven to saturation by the positive feedback produced by the flow of collector current through the associated feedback winding on the driver transformer 34. The amount of collector current flow at saturation is dependent upon the inverter load, but the positive feedback effect will always drive a conducting power transistor to saturation and hold it there for the entire duration of a signal pulse. Upon completion of the pulse and return to the no signal input condition caused by the switching delay time, the primary winding 33 of the driver transformer 34 will again be effectively short circuited and the power amplifier stage returned to its quiescent condition with the power transistors 43 and 44 cut off. Hence, the driver stage acts as a combination disabling and triggering circuit to stabilize and control the operation of the power amplifier stage.

The series of rectangular voltage pulses applied to primary winding 51 of the output transformer 52 induces a voltage in the secondary winding 55. This output voltage is fed to the output terminals 56 and 57.

Although the basic embodiment of the present invention, as hereinabove discussed with respect to FIGURE 1, is suitable in any application wherein it is desired to amplify a series of signal pulses of generally rectangular waveshape, certain modifications of power output stage of the basic embodiment render the invention particularly suitable for use in static inverter devices producing a sine wave output. Referring now to FIGURE 2 of the accompanying drawing, there is shown an alternative embodiment of the power amplifier stage of the present invention suitable for such application. In order to convert the rectangular voltage pulses into a sine wave a resonating capacitor 58 is connected across the primary winding 55 of the output transformer 52, the capacitance value of the capacitor 58 being that necessary to resonate the secondary winding 55 at the desired sine wave output frequency. Since large amounts of power are to be handled, the capacitance value of the capacitor 58 must be relatively large, thereby necessitating a small inductance value for the secondary winding 55. To achieve the necessary small secondary winding inductance value the output transformer 52 is constructed with a relatively large mica-filled air gap. Undesirable harmonics are suppressed through connection of a harmonic filter, consisting of an inductance 59 and a series capacitance 61, between the output terminals 56 and 57. This harmonic filter is preferably tuned to the third harmonic of the desired A.C. sine wave frequency. To complete the filtering an inductance 62 is inserted between the center tap of the primary winding 51 of the output transformer 52 and the negative return lead 54. The purpose of the inductance 62 is to absorb the power difference between the sine wave output and the rectangular wave input.

Turning now to FIGURE 3 there is shown another alternative embodiment of the power output stage of the present invention for use in applications wherein it is desirable to provide a regulated D.C. output voltage or current. In this particular embodiment it can be seen that the base and emitter circuits of the power transistors 43 and 44 are identical with those shown in FIGURE 1. The collector circuits, however, have been changed from the previously illustrated push-pull A.C. configuration to a parallel D.C. configuration. The collector element 49 of the power transistor 43 is connected to one end of the first feedback winding 37 of the driver transformer 34, the other end of the first feedback winding 37 being connected directly to the output terminal 56 through an electrical lead 63. The collector electrode 53 of the power transistor 44 is connected to one end of the second feedback winding 38 of the driver transformer 34, the other end of the winding being connected directly to the output terminal 56 through an electrical lead 64. The output terminal 57 is connected to the negative D.C. voltage terminal 11 through an electrical lead 65. The output voltage appearing across the terminals 56 and 57 will be a series of notch-regulated D.C. pulses of constant magnitude and period. Variations in the pulse length of the output voltage will accordingly vary the average power supplied to a load connected across the output terminals 56 and 57, without any significant variation of dissipated power. Hence, the power amplifier operates at the same high efficiency, independent of the amount of power it produces.

A practical example of the use of the embodiment shown in FIGURE 3 is as an efficient power regulating device for electric lighting. The lighting brilliance can be determined by manual control of the operation of the D.C. amplifier feeding the pulse forming stage to thereby determine the pulse length of the output voltage. Hence, the average power supplied to the load can be reduced, not by the dissipation of excessive output power in a rheostat, but by reduction of the amount of power actually produced.

Furthermore, by insertion of a suitable filter between the output terminals and the load, the pulsating D.C. output voltage can be smoothed to a steady D.C. output. Such a filter commonly utilizes series inductance and shunt capacitance to store energy during pulse intervals and discharge it into the load during the notch intervals.

It is apparent that the natural period of regeneration of any of the hereinabove described power output stages should be greater than the period of the signal input voltage, i.e., the regeneration frequency of the power amplifier stage should be lower than the frequency of the signal input voltage. The regeneration frequency of such power amplifier stages is determined by the saturation characteristics of the driver transformer core, hence a driver transformer that does not become saturated when operated at the desired signal input frequency is utilized.

Thus, there has been described novel switched transistor power amplifier systems suitable for use in voltage or current regulators, open or closed loop servo systems, or systems in which it is desired to amplify a generally rectangular waveshape. Although the present invention has been described with a certain degree of particularity, it is understood that the present disclosure has been made only by way of example and that numerous changes in the circuitry and the combination and arrangement of parts may be resorted to without departing from the spirit and the scope of the invention as hereinafter claimed. For example, although the particular embodiments illustrated utilize current feedback the present invention is equally suitable for use with positive voltage feedback. In addition, although separate batteries have been shown as the sources of bias voltages for the illustrated driver and power output stages, it is within the purview of the present invention to utilize any suitable method for obtaining the necessary bias.

What is claimed is:

1. A power amplifier system for amplifying signal input voltage pulses of generally rectangular waveshape comprising, in combination: a regenerative amplifier including a transistor, said amplifier having signal input and signal output circuits and including a positive feedback loop to provide said regeneration, the natural frequency of regeneration of said power amplifier being lower than the frequency of said signal input voltage pulses; signal input terminals adapted for coupling to a source of said signal voltage pulses; biasing means connected to normally bias said transistor in the reverse direction, the magnitude of the reverse bias voltage applied to said transistor by said biasing means being less than the magnitude of said input signal voltage pulses applied to said transistor through said signal input circuit; triggering and disablnig circuit means coupling said signal input terminals to said signal input circuit for application of signal input voltage pulses to said signal input circuit and for selectively effectively short-circuiting said signal input circuit in the absence of signal input voltage pulse; output terminals; and output coupling means connecting said signal output circuit with said output terminals.

2. A power amplifier system for amplifying signal input voltage pulses of generally rectangular waveshape comprising, in combination: a regenerative amplifier including first and second transistors, said amplifier having signal input and signal output circuits and including a positive feedback loop to provide said regeneration, the natural frequency of regeneration of said power amplifier being lower than the frequency of said signal input voltage pulses, said signal input circuit being arranged in a push-pull configuration; signal input terminals for coupling to a source of said signal input voltage pulses; biasing means connected to normally bias said transistors in the reverse direction, the magnitude of the reverse bias voltage applied to said transistors by said biasing means being less than the magnitude of said signal input voltage pulses applied to said transistors through said signal input circuit; triggering and disabling circuit means coupling said signal input terminals to said signal input circuit for application of signal input voltage pulses to said signal input circuit and for selectively effectively short-circuiting said signal input circuit in the absence of a signal input voltage pulse; output terminals; and output coupling means connecting said signal output circuit with said output terminals.

3. A power amplifier system for amplifying signal input voltage pulses of generally rectangular waveshape comprising, in combination: a driver stage for connection to a source of said signal input voltage pulses; a regenerative power amplifier including first and second transistors, said power amplifier having signal input and signal output circuits and including a positive feedback loop to provide said regeneration, the natural frequency of regeneration of said power amplifier being lower than the frequency of said signal input voltage pulses; biasing means connected to normally bias said transistors in the reverse direction, the magnitude of the reverse bias voltage applied to said transistors by said biasing means being less than the magnitude of said signal input voltage pulses applied to said transistor through said signal input circuit; triggering and disabling circuit means coupling the output of said driver stage to the signal input circuit of said power amplifier for applying signal voltage pulses to said signal input circuit and for selectively effectively short-circuiting said signal input circuit in the absence of a signal voltage pulse output from said driver stage; output terminals; and output coupling means connecting said signal output circuit with said output terminals.

4. A power amplifier system for amplifying signal input voltage pulses of generally rectangular waveshape comprising, in combination: a push-pull transistor driver stage including first and second transistors for coupling to a source of said signal voltage; first biasing means for producing a first bias voltage, said first biasing means being connected to normally bias said first and second transistors to saturation, the magnitude of said first bias voltage being such that said signal input voltage pulses are sufficient to overcome said first bias voltage and to abruptly bias said first and second transistors in the reverse direction to thereby operate said first and second transistors in a switching mode; a regenerative power amplifier including third and fourth transistors, said power amplifier having signal input and signal output circuits and including a positive feedback loop to provide said regeneration, the natural frequency of regeneration of said power amplifier being lower than the frequency of said signal input voltage pulses; second biasing means for producing a second bias voltage, said second biasing means being connected to normally bias said third and fourth transistors in the reverse direction, the magnitude of said second bias voltage applied to said third and fourth transistors by said second biasing means being less than the magnitude of said signal input voltage pulses applied to said third and fourth transistors through said signal input circuit; triggering and disabling circuit means coupling the output of said driver stage to the signal input circuit of said power amplifier for application of signal voltage pulses to said signal input circuit and for selectively effectively short-circuiting said signal input circuit in the absence of a signal voltage pulse output from said driver stage; and output coupling means connecting said signal output circuit with said output terminals.

5. A power amplifier system for amplifying signal input voltage pulses of generally rectangular waveshape comprising, in combination: a push-pull driver stage including first and second transistors for coupling to a source of said signal input voltage pulses; first biasing means for producing a first bias voltage, said first biasing means being connected to normally bias said first and second transistors to saturation, the magnitude of said first biasing voltage being such that said signal input voltage pulses are sufficient to overcome said first bias voltage to abruptly bias said first and second transistors in the reverse direction to thereby operate said first and second transistor in a switching mode; a regenerative power amplifier including third and fourth transistors, said power amplifier having signal input and signal output circuits and including a positive feedback loop to provide said regeneration, the natural frequency of regeneration of said power amplifier being lower than the frequency of said signal input voltage pulses, said signal input circuit being connected in a push-pull configuration; second biasing means for producing a second bias voltage, said second biasing means being connected to normally bias said third and fourth transistors in the reverse direction, the magnitude of said second bias voltage applied to said third and fourth transistors being less than the magnitude of signal input voltage pulses applied to said third and fourth transistors through said signal input circuit; triggering and disabling circuit means interconnecting the signal input circuit of said power amplifier with the output of said driver stage for application of signal input voltage pulses to said signal input circuit and for selectively effectively short-circuiting said signal input circuit, clamping means being coupled to said feedback loop during periods of saturation of said first and second transistors to thereby prevent regeneration of said amplifier stage during said saturation periods; output terminals; and, output coupling means interconnecting said signal output circuit of said power amplifier with said output terminals.

6. A power amplifier system for amplifying signal input voltage pulses of generally rectangular waveshape comprising, in combination: a push-pull driver stage including first and second transistors for coupling to a source of said signal input voltage pulses; a first biasing means for producing a first bias voltage, said first biasing mean being connected to normally bias said first and second transistors to saturation, the magnitude of said first biasing voltage being such that said signal input voltage pulses are sufficient to overcome said first bias voltage to abruptly bias said first and second transistors in the reverse direction to thereby operate said first and second transistors in a switching mode; a driver transformer having primary and secondary windings and first and second current feedback windings, the primary winding of said driver transformer being connected to said first and second transistors for the flow of transistor output current therethrough; a regenerative power amplifier including third and fourth transistors, said power amplifier having signal input and signal output circuits said signal input circuit being connected in a push-pull configuration to the secondary winding of said driver transformer, said signal output circuit being connected to said third transistor through said first current feedback winding and to said fourth transistor through said second current feedback winding to thereby provide said regeneration, the natural frequency of regeneration of said power amplifier being lower than the frequency of said signal input voltage pulses; second biasing means for producing a second bias voltage, said second biasing means being connected to normally bias said third and fourth transistors in the reverse direction, the magnitude of said second bias voltage applied to said third and fourth transistors being less than the magnitude of said signal input voltage pulses applied to said third and fourth transistors; output terminals; and, output coupling means interconnecting said signal output circuit of said power amplifier with said output terminals.

7. A power amplifier system for amplifying signal input voltage pulses of generally rectangular waveshape comprising, in combination: a driver stage including a first transistor for coupling to a source of signal input voltage pulses; biasing means for producing a first bias voltage, said biasing means being connected to normally bias said first transistor to saturation, the magnitude of said first biasing voltage being such that said signal input voltage pulses are sufficient to overcome said first bias voltage to abruptly bias said first transistor in the reverse direction to thereby operate said first transistor in a switching mode; a driver transformer having primary and secondary windings and a current feedback winding, the primary winding of said driver transformer being coupled to said first transistor for the flow of transistor output current therethrough; a regenerative power amplifier including a second transistor, said power amplifier having signal input and signal output circuits, said signal input circuit being coupled to said secondary winding of said driver transformer, said signal output circuit being coupled to said second transistor through said current feedback winding to thereby provide regeneration, the natural frequency of regeneration of said power amplifier being lower than the frequency of said signal input voltage pulses; biasing means for producing a second bias voltage, said biasing means being connected to normally bias said second transistor in the reverse direction, the magnitude of said second bias voltage applied to said second transistor being less than the magnitude of said signal input voltage pulses applied to said second transistor through said signal input circuit; output terminals; and, output coupling means interconnecting said signal output circuit of said power amplifier with said output terminals.

8. A power amplifier system for amplifying signal input voltage pulses of generally rectangular waveshapes comprising, in combination: a driver transformer having primary and secondary windings and a current feedback winding; signal input terminals for coupling to a source of said signal input voltage pulses; triggering and disabling circuit means coupling said signal input terminals to said primary winding of said driver transformer for application of signal input voltage pulses to said primary winding and for selectively effectively short-circuiting said primary winding in the absence of a signal input voltage pulse; a regenerative power amplifier including a transistor, said power amplifier having signal input and signal output circuits, said signal input circuit being coupled to said secondary winding of said driver transformer, said signal output circuit being coupled to said transistor through said current feedback winding to thereby provide regeneration, the natural frequency of regeneration of said power amplifier being lower than the frequency of said signal input voltage pulses; biasing means for producing a bias voltage, said biasing means being connected to normally bias said transistor in the reverse direction, the magnitude of said bias voltage applied to said transistor being less than the magnitude of said signal input voltage pulses applied to said transistor through said signal input circuit; output terminals; and, output coupling means interconnecting said signal output circuit of said power amplifier with said output terminals.

References Cited in the file of this patent

UNITED STATES PATENTS

| | | |
|---|---|---|
| 2,760,087 | Felker | Aug. 21, 1956 |
| 2,835,828 | Vogelsong | May 20, 1958 |